(12) United States Patent
Abou-Khalil et al.

(10) Patent No.: US 8,847,354 B2
(45) Date of Patent: Sep. 30, 2014

(54) METAL-INSULATOR-METAL CAPACITORS WITH HIGH CAPACITANCE DENSITY

(71) Applicant: International Business Machines Corporation, Armonk, NY (US)

(72) Inventors: Michel J. Abou-Khalil, Essex Junction, VT (US); Robert J. Gauthier, Jr., Hinesburg, VT (US); Tom C. Lee, Essex Junction, VT (US); Junjun Li, Willston, VT (US); Souvick Mitra, Essex Junction, VT (US); Christopher S. Putnam, Hinesburg, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/749,146

(22) Filed: Jan. 24, 2013

(65) Prior Publication Data
US 2013/0134557 A1   May 30, 2013

Related U.S. Application Data

(62) Division of application No. 12/969,004, filed on Dec. 15, 2010, now Pat. No. 8,445,355.

(51) Int. Cl.
| | |
|---|---|
| H01L 21/02 | (2006.01) |
| H01L 29/94 | (2006.01) |
| H01L 23/522 | (2006.01) |
| H01L 49/02 | (2006.01) |
| H01L 27/02 | (2006.01) |

(52) U.S. Cl.
CPC ............ *H01L 28/82* (2013.01); *H01L 23/5223* (2013.01); *H01L 27/0207* (2013.01); *H01L 28/90* (2013.01)

USPC ................ 257/532; 257/306; 257/E21.014; 257/E21.016

(58) Field of Classification Search
CPC .................... H01L 23/5223; H01L 23/53238; H01L 21/76831; H01L 21/76877
USPC .......... 257/301, 306, 532, E21.012, E21.016, 257/E21.018, 310
See application file for complete search history.

(56) References Cited

U.S. PATENT DOCUMENTS

| | | | |
|---|---|---|---|
| 6,468,858 B1 * | 10/2002 | Lou ............................... | 438/253 |
| 6,765,255 B2 | 7/2004 | Jin et al. | |

(Continued)

OTHER PUBLICATIONS

USPTO, Notice of Allowance issued in related U.S. Appl. No. 12/969,004 dated Jan. 9, 2013.

(Continued)

*Primary Examiner* — Jerome Jackson, Jr.
*Assistant Examiner* — Paul Budd
(74) *Attorney, Agent, or Firm* — Wood, Herron & Evans LLP; Anthony J. Canale

(57) ABSTRACT

Metal-insulator-metal (MIM) capacitors and methods for fabricating MIM capacitors. The MIM capacitor includes an interlayer dielectric (ILD) layer with apertures each bounded by a plurality of sidewalls and each extending from the top surface of the ILD layer into the first interlayer dielectric layer. A layer stack, which is disposed on the sidewalls of the apertures and the top surface of the ILD layer, includes a bottom conductive electrode, a top conductive electrode, and a capacitor dielectric between the bottom and top conductive electrodes.

7 Claims, 9 Drawing Sheets

(56) References Cited

U.S. PATENT DOCUMENTS

| | | |
|---|---|---|
| 7,067,869 B2 | 6/2006 | Cheng et al. |
| 7,534,692 B2 | 5/2009 | Jagueneau et al. |
| 2007/0075348 A1* | 4/2007 | Williams et al. ............. 257/309 |
| 2009/0108403 A1* | 4/2009 | Gogoi ........................... 257/532 |
| 2010/0032801 A1* | 2/2010 | Jacobs et al. ................. 257/532 |

OTHER PUBLICATIONS

USPTO, Office Action issued in related U.S. Appl. No. 12/969,004 dated Jul. 18, 2012.

* cited by examiner

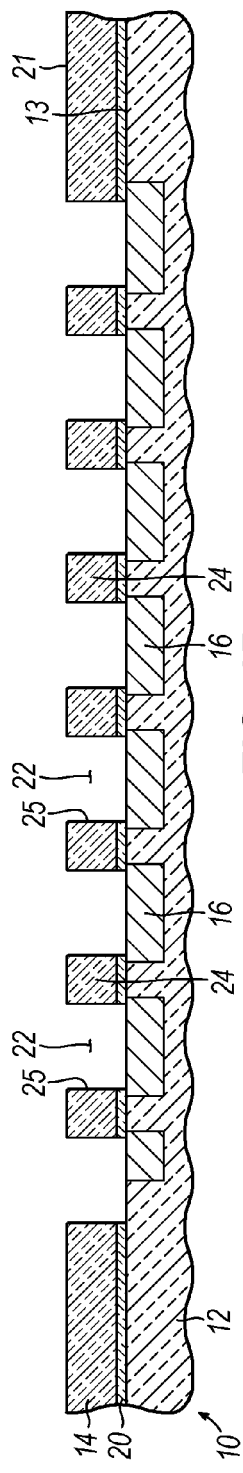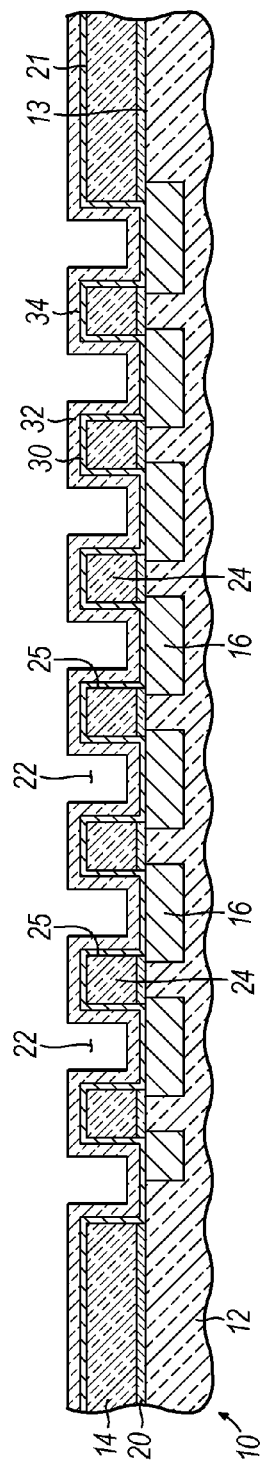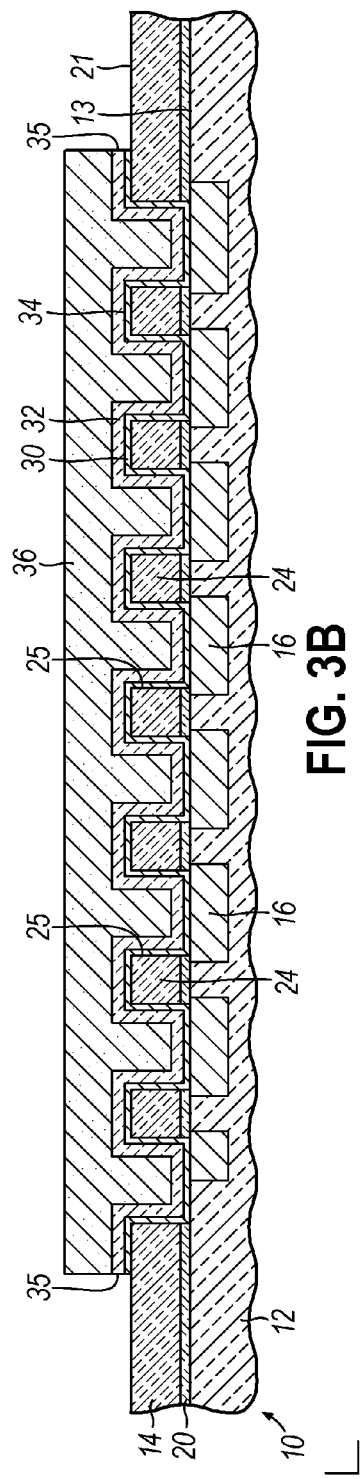

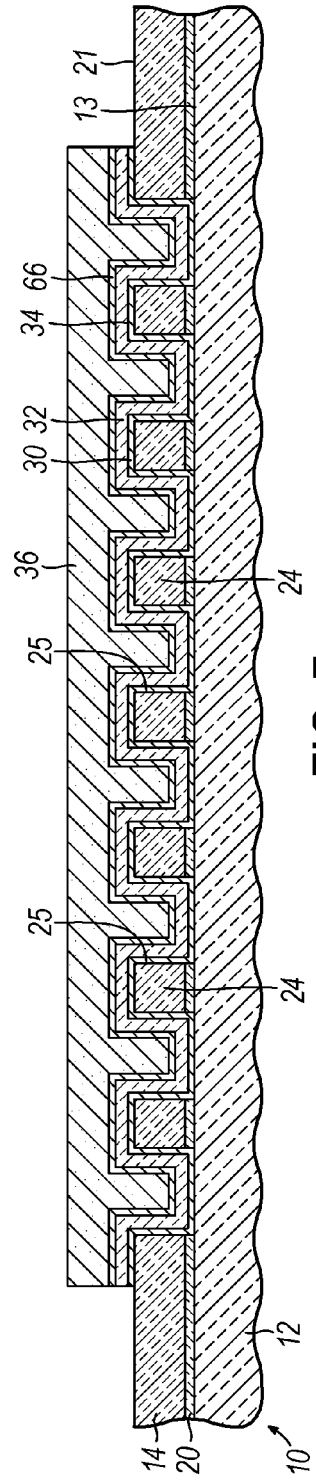
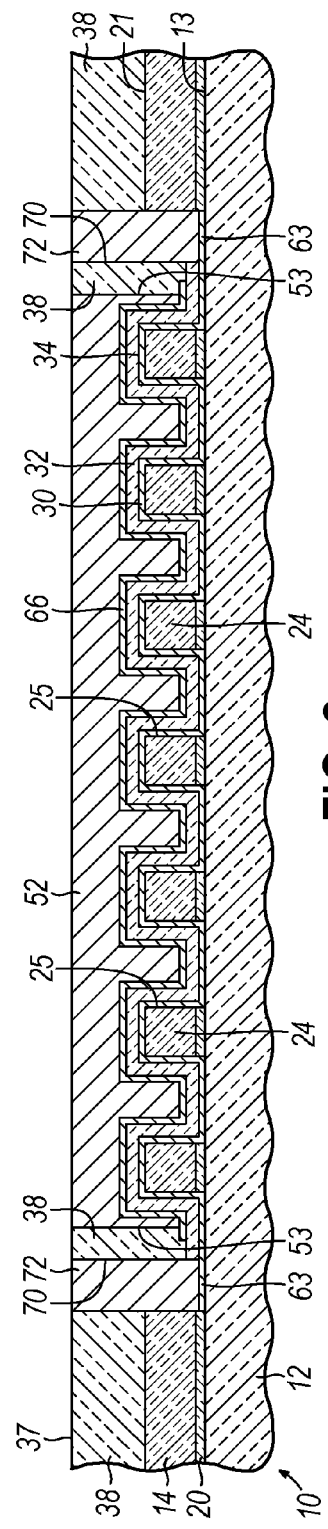
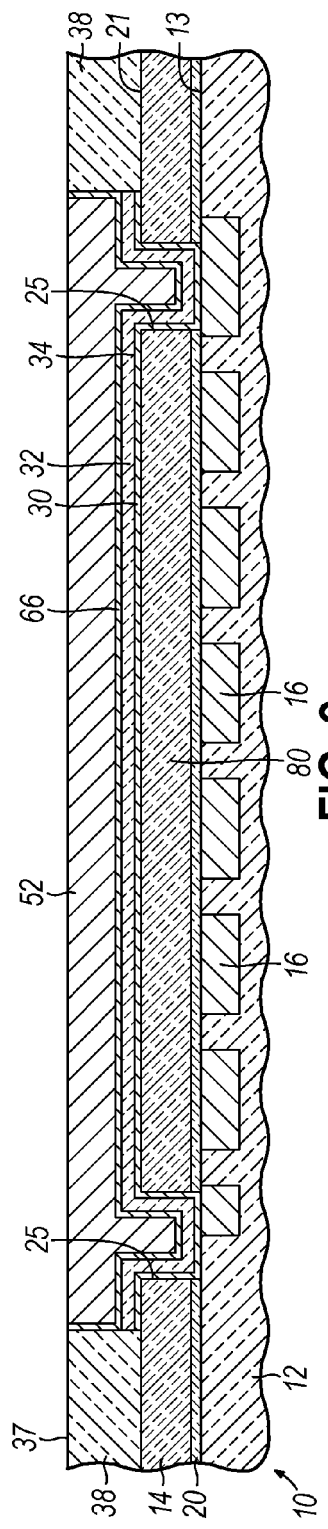

US 8,847,354 B2

METAL-INSULATOR-METAL CAPACITORS WITH HIGH CAPACITANCE DENSITY

CROSS-REFERENCE TO RELATED APPLICATIONS

This application is a divisional of application Ser. No. 12/969,004, filed Dec. 15, 2010, which is hereby incorporated by reference herein in its entirety.

BACKGROUND

The invention relates generally to semiconductor device fabrication and, in particular, to methods for fabricating a metal-insulator-metal (MIM) capacitor and structures for a MIM capacitor.

On-chip passive elements, such as MIM capacitors, are deployed in many types of integrated circuits, such as radiofrequency integrated circuits (RFICs), and may be integrated into one or more of the metallization levels of the BEOL interconnect structure using the BEOL metallurgy. The BEOL interconnect structure is routinely fabricated by damascene processes. For example, in a dual damascene process, vias and trenches are etched in one or more dielectric layers using reactive ion etching (RIE) and are simultaneously filled with a plugs and wiring using a single blanket deposition of a conductor and planarization. The process of dielectric deposition, via and trench etch, conductor deposition, and planarization is replicated to generate stacked metallization levels of the BEOL interconnect structure.

A MIM capacitor is a stacked structure formed in the BEOL interconnect structure. A two-electrode MIM capacitor includes planar top and bottom conductive plates, which operate as electrodes, and an interplate dielectric layer disposed between the top and bottom conductive plates as an electrical insulator. The capacitance, or amount of charge held by the MIM capacitor per applied voltage, depends upon the area of the top and bottom conductive plates, their separation, and the dielectric constant of the material constituting the interplate dielectric layer.

Improved methods are needed for fabricating MIM capacitors, as well as improved structures for MIM capacitors.

BRIEF SUMMARY

In an embodiment of the invention, a method is provided for fabricating a metal-insulator-metal (MIM) capacitor. The method includes depositing an interlayer dielectric (ILD) layer having a top surface and forming a plurality of apertures each bounded by a plurality of sidewalls extending from the top surface of the ILD layer into the ILD layer. A layer stack, which includes a bottom electrode layer and a capacitor dielectric layer, is deposited on the top surface of the ILD layer and the sidewalls bounding each of the apertures. The method further includes forming a block mask that covers a first surface area of ILD layer including the apertures and that exposes a second surface area of the ILD layer surrounding the first surface area. The layer stack is removed from the second surface area to define a perimeter of the layer stack.

In an embodiment of the invention, a metal-insulator-metal (MIM) capacitor includes an interlayer dielectric (ILD) layer having a top surface and a plurality of apertures each bounded by a plurality of sidewalls extending from the top surface of the ILD layer into the ILD layer. A layer stack, which is disposed on the sidewalls of the apertures and the top surface of the ILD layer, includes a bottom conductive electrode, a top conductive electrode, and a capacitor dielectric between the bottom and top conductive electrodes.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1B is a cross-sectional view taken generally along line 1B-1B of FIG. 1A.

FIG. 2B is a cross-sectional view taken generally along line 2B-2B of FIG. 2A.

FIG. 3B is a cross-sectional view taken generally along line 3B-3B of FIG. 3A.

FIG. 7 is a cross-sectional view similar to FIG. 5B of a MIM capacitor in accordance with an alternative embodiment of the invention.

FIG. 8 is a cross-sectional view similar to FIG. 5B of a MIM capacitor in accordance with an alternative embodiment of the invention.

FIG. 9 is a cross-sectional view similar to FIG. 5B of a MIM capacitor in accordance with an alternative embodiment of the invention.

DETAILED DESCRIPTION

Figure 1A:
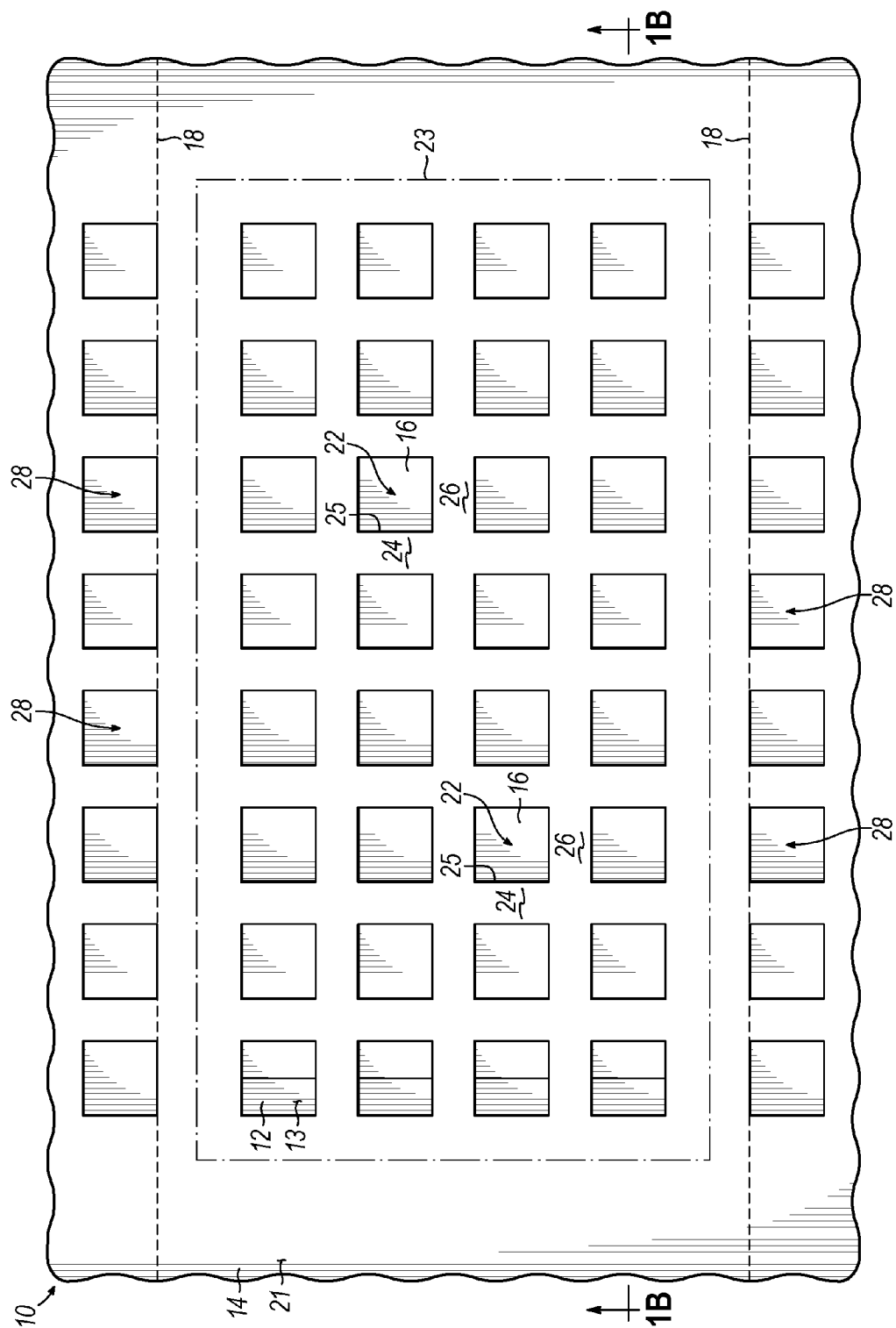
FIG. 1A is a top view of a portion of a substrate at an initial fabrication stage of a processing method for fabricating a device structure in accordance with an embodiment of the invention.

With reference to FIGS. 1A, 1B and in accordance with an embodiment of the invention, a back-end-of-line (BEOL) interconnect structure, generally indicated by reference numeral 10, includes a dielectric layer 12 constituting an interlayer dielectric (ILD) of a metallization level ($M_x$), conductive wiring features 16, 18 embedded in the dielectric layer 12 of metallization level ($M_x$), and a dielectric layer 14 constituting an interlayer dielectric (ILD) of a metallization level ($M_{x+1}$). Additional metallization levels (not shown) may exist below the metallization level ($M_x$). Typical constructions for the BEOL interconnect structure 10 may consist of about two (2) to about eight (8) metallization levels. The metallization levels of the BEOL interconnect structure 10 are formed by known techniques characteristic of damascene processes conventionally associated with BEOL processing.

The dielectric layers 12, 14 provide physical and electrical separation between different metallization levels.

The dielectric layers 12, 14 of the BEOL interconnect structure 10 may be comprised of any suitable organic or inorganic electrical insulator or dielectric material recognized by a person having ordinary skill in the art. Candidate inorganic dielectric materials may include, but are not limited to, silicon dioxide ($SiO_2$), fluorine-doped silicon glass (FSG), and combinations of these dielectric materials. Alternatively, the dielectric material of dielectric layers 12, 14 may be characterized by a relative permittivity or dielectric constant smaller than the dielectric constant of silicon dioxide, which is about 3.9. Candidate low-k dielectric materials include, but are not limited to, porous and nonporous spun-on organic low-k dielectrics, such as spin-on aromatic thermoset polymer resins like polyarylenes, porous and nonporous inorganic low-k dielectrics like organosilicate glasses, hydrogen-enriched silicon oxycarbide (SiCOH), and carbon-doped oxides, and combinations of these and other organic and inorganic dielectrics. The dielectric layers 12, 14 may be deposited by any number of well known conventional techniques such as sputtering, spin-on application, chemical vapor deposition (CVD) process or a plasma-enhanced CVD (PECVD) process.

An etch stop layer 20 is optionally disposed between the dielectric layers 12, 14. The etch stop layer 20 may be comprised of any organic or inorganic dielectric material that is an electrical insulator and that etches selectively to the dielectric material forming the dielectric layer 12. For example, the etch stop layer 20 may be a thin film comprised of porous or non-porous hydrogen-enriched silicon oxycarbide (SiCOH), also known as organosilicate glass (OSG) or carbon doped oxide (CDO), and having a dielectric constant of about 3.0 or less. The composition and properties of such inorganic low-k dielectric materials may vary contingent upon the selection of deposition conditions and source gases. The etch stop layer 20 may be comprised of other low-k dielectric materials, such as or methyl silsesquioxane polymer (MSQ), or from materials like silicon oxycarbonitride (SiOCN), silicon nitride ($Si_3N_4$), silicon carbonitride (SiCN), or silicon carbide (SiC). The etch stop layer may be deposited on the top surface 13 of dielectric layer 12 by, for example, CVD or PECVD.

The conductive wiring features 16, 18 of the BEOL interconnect structure 10 may be comprised of a metal such as copper, aluminum, or an alloy of these metals. In the representative construction, the conductive wiring feature 16 is not solid metal, but is instead cheesed with metal portions removed and replaced by dielectric material from dielectric layer 12.

The BEOL interconnect structure 10 is carried on a die or chip (not shown) that has been processed by front-end-of-line (FEOL) processes, such as a complementary metal-oxide-semiconductor (CMOS) process, to fabricate one or more integrated circuits that contain device structures. Conductive features in the different metallization levels interconnect devices of the integrated circuit and may provide circuit-to-circuit connections, or may establish contacts with input and output terminals. The chip may be formed from any suitable wafer of semiconductor material that a person having ordinary skill in the art would recognize as suitable for integrated circuit fabrication.

Multiple openings or apertures 22 are formed in a region, generally indicated with reference numeral 23, of the dielectric layer 14 that will be used to form the MIM capacitor. The apertures 22 in the MIM capacitor region 23 may be formed by patterning the constituent dielectric material using conventional lithography and etch operations characteristic of a damascene process. To that end, a resist layer (not shown) is applied to a top surface 21 of dielectric layer 14, exposed to radiation to impart a latent image of a hole pattern, and developed to transform the latent image into a final image pattern with laterally dispersed surface areas of dielectric layer 14 unmasked at the intended sites of apertures 22. Unmasked regions of dielectric layer 14 at these intended sites are removed with an etching process, such as reactive ion etching (RIE), capable of producing substantially vertical sidewalls 25 bounding apertures 22. The RIE process stops on etch stop layer 20 and, then, the chemistry of the RIE process is modified to extend the apertures 22 through the etch stop layer 20 to a top surface 13 of dielectric layer 12. The apertures 22 may have an array arrangement, as depicted in the representative embodiment. The apertures 22 may be square, rectangular, or any other geometrical shape as comprehended by a person having ordinary skill in the art, and may have a cross-sectional area measured in a direction normal to the top surface 13.

The apertures 22 penetrate into the dielectric layer 14 and etch stop layer 20 in the MIM capacitor region 23. At least one of the apertures 22 lands either partially or totally on the conductive wiring feature 16 and, preferably, all of the apertures 22 land either partially or totally on the conductive wiring feature 16. The apertures 22 parse the dielectric material in the MIM capacitor region 23 into parallel lines 24 of the dielectric material of dielectric layer 14 that are aligned orthogonal to other parallel lines 26 of dielectric layer 14. The parallel lines 24, 26 have a grid-like arrangement because the apertures 22 in the representative embodiment are arranged in rows and columns of an array. The thickness of the residual lines 24, 26 may be equal to the physical layer thickness of the dielectric layer 14. The sidewalls 25 of dielectric material of the residual lines 24, 26, which peripherally bound the apertures 22, may extend from the top surface 21 of dielectric layer 14 to the top surface 13 of dielectric layer 12 such that the apertures 22 perforate the dielectric layer 14.

Vias 28 of metallization level ($M_x$) may be formed in the dielectric layer 14 and etch stop layer 20 outside of the area in which the apertures 22 are formed. Each of the vias 28 may land on one of the conductive wiring features 18. In one embodiment, the patterned resist layer used to form the apertures 22 may be a via mask that further includes windows used to form the vias 28. Hence, the same via mask and the same lithography and etch operations may be used to form the vias 28 of metallization level ($M_x$) and the apertures 22. In the representative embodiment, the dimension and pitch of the vias 28 is identical to the dimension and pitch of the apertures 22. However, the dimensions and pitch of the vias 28 may be selected independently of the dimensions and pitch of the apertures 22 so that the dimensions and pitch are not identical.

Figure 2A:
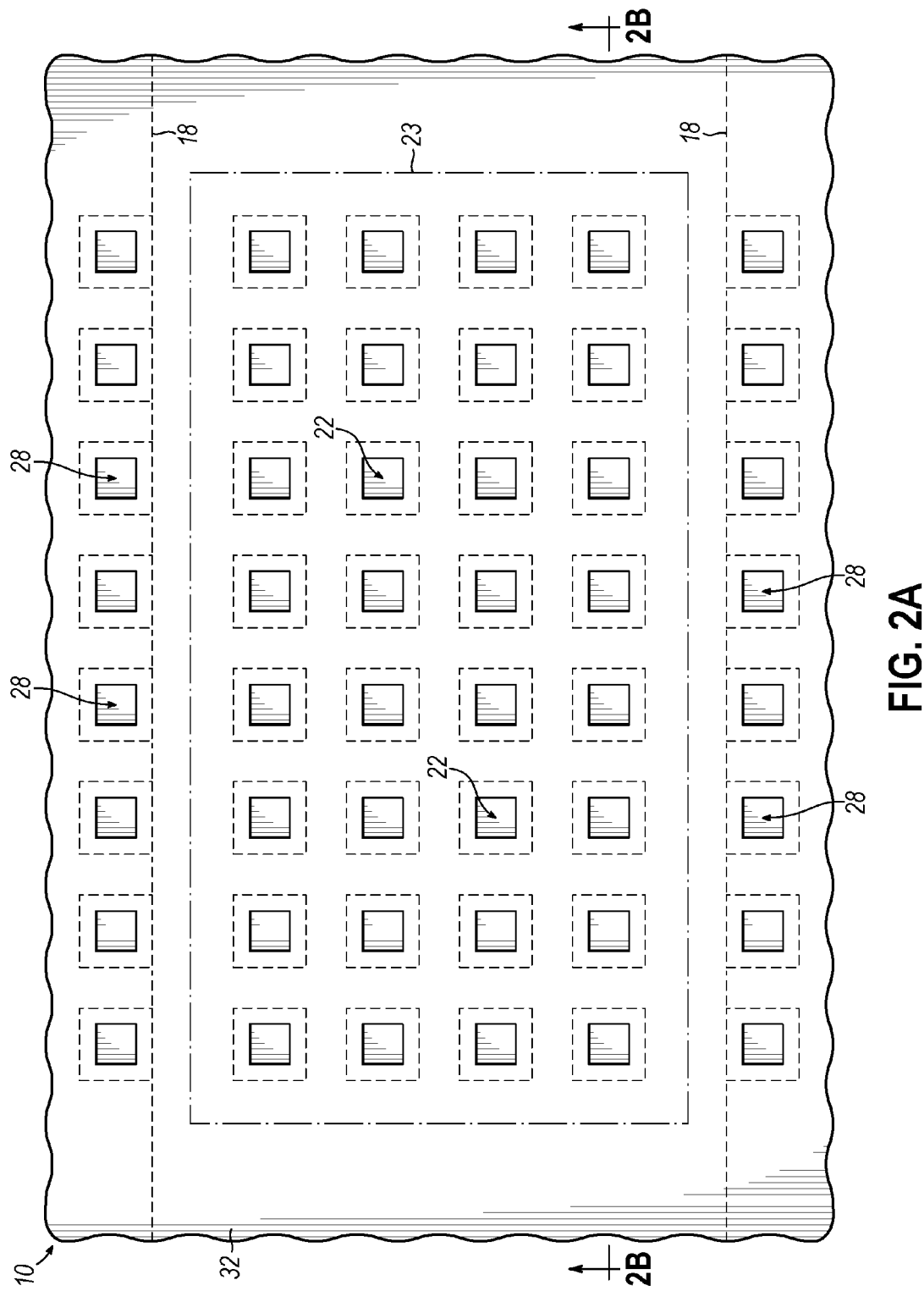
FIG. 2A is a top view of the substrate portion of FIG. 1A at a subsequent fabrication stage of the processing method.

With reference to FIGS. 2A, 2B in which like reference numerals refer to like features in FIGS. 1A, 1B and at a subsequent fabrication stage, layers 30, 32 are serially formed to define a layer stack. Layer 30 is initially deposited and is preferably conformally deposited with a physical layer thickness that remains approximately constant independent of the geometry of underlying features. Layer 30 coats the top surface 21 of the dielectric layer 14, the sidewalls 25 bounding the apertures 22, and the areas of the top surface 13 of dielectric layer 12 and conductive wiring feature 16 exposed at the base of each aperture 22. Layer 30 directly contacts the conductive wiring feature 16 at the base of each aperture 22 to establish a physical and electrical connection between layer 30 and the conductive wiring feature 16.

After layer 30 is formed, layer 32 is deposited and is preferably conformally deposited with a physical layer thickness that remains approximately constant independent of the geometry of underlying features. Layer 32 coats a top surface 34 of the layer 30, which is disposed between layer 32 and the dielectric material of dielectric layers 12, 14 and conductive wiring feature 16. Layer 32 indirectly coats the top surface 21 of dielectric layer 14, the sidewalls 25 bounding the apertures 22, and the areas of the top surface 13 of dielectric layer 12 and conductive wiring feature 16 exposed at the base of each aperture 22.

Layer 30 is comprised of one or more conductive materials, such as titanium nitride (TiN), tantalum nitride (TaN), tantalum (Ta), titanium (Ti), tungsten (W), tungsten nitride (WN), ternary refractory metals like titanium silicon nitride (TiSiN), tantalum silicon nitride (TaSiN), or tungsten silicon nitride (WSiN). Each conductive material of layer 30 may be deposited by, for example, direct current (DC) sputtering or radio frequency (RF) sputtering. Alternatively, layer 30 may contain multi-layered combinations of these materials, such as either Ti clad with TiN or Ta clad with TaN.

Layer 32 may be comprised of one or more dielectric materials deposited by atomic layer deposition (ALD), CVD, or another conventional deposition technique. The capacitance of a MIM capacitor generally scales with the dielectric constant of the dielectric material of layer 32. The dielectric material comprising layer 32 may be $SiO_2$ or $Si_3N_4$. Alternatively, the dielectric material selected for layer 32 may be a high-k dielectric having a dielectric constant (e.g., permittivity) higher than the dielectric constant of $SiO_2$. In particular, candidate high-k dielectrics for layer 32 may have a dielectric constant greater than 10 and, preferably, a dielectric constant in a range of 10 to 100. Air, which is an accepted reference point for values of dielectric constant, has a dielectric constant of approximately unity. Suitable high-k dielectrics for layer 32 include, but are not limited to, aluminum oxide ($Al_2O_3$), zirconium oxide ($ZrO_2$), tantalum pentoxide ($Ta_2O_5$), lanthanum oxide ($La_2O_3$), zirconium oxide ($ZrO_2$), zirconium silicon oxide (ZrSiO), yttrium oxide ($Y_2O_3$), strontium oxide (SrO), or strontium titanium oxide (SrTiO), a hafnium-based dielectric material like hafnium oxide ($HfO_2$), hafnium silicate (HfSiO), or nitrided hafnium silicate (HfSiON), layered stacks of these materials and other dielectric materials, mixtures of these materials, and other like materials.

Figure 3A:
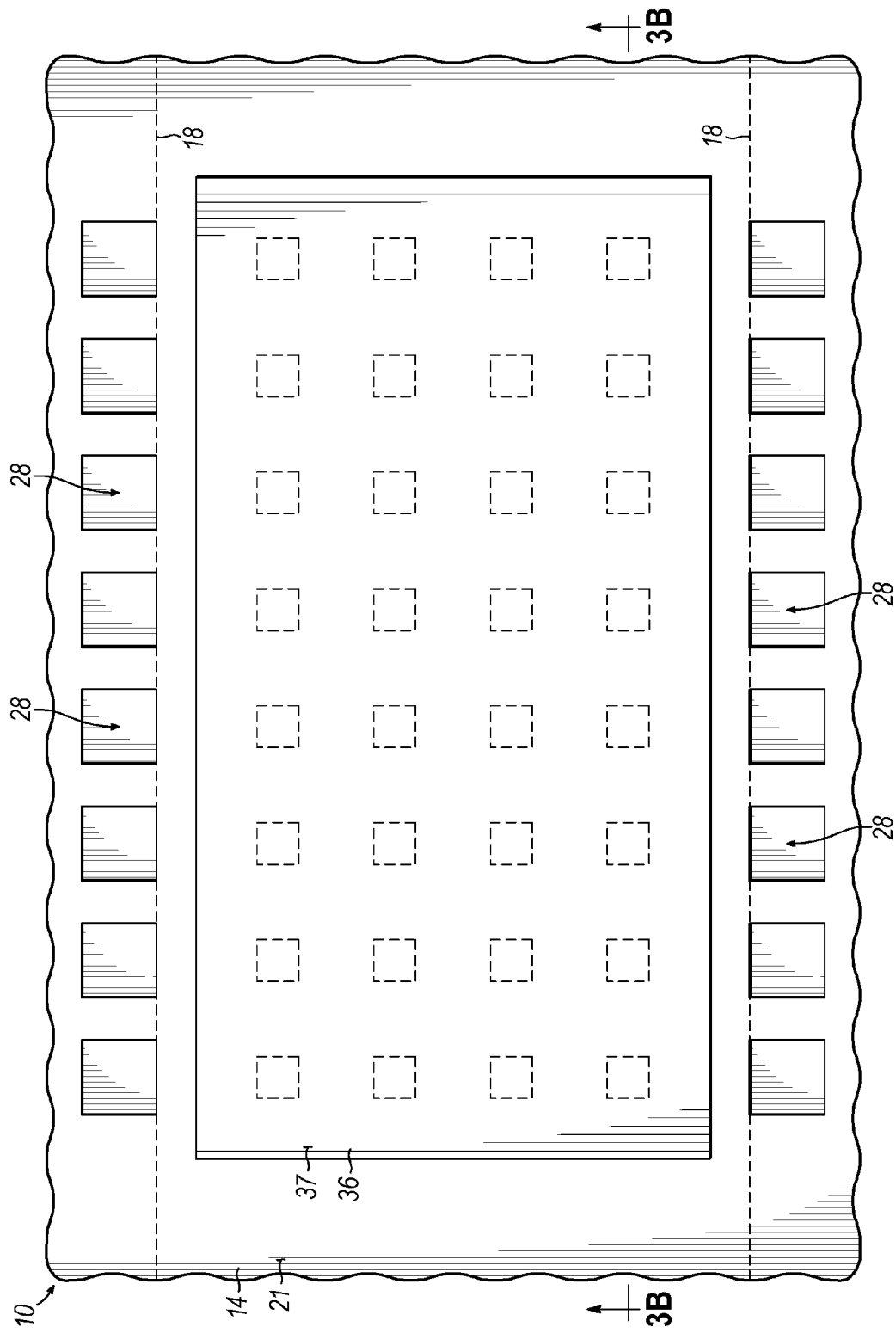
FIG. 3A is a top view of the substrate portion of FIG. 2A at a subsequent fabrication stage of the processing method.

With reference to FIGS. 3A, 3B in which like reference numerals refer to like features in FIGS. 2A, 2B and at a subsequent fabrication stage, a block mask 36 is applied in the MIM capacitor region 23 that contains the apertures 22 and residual lines 24, 26 of dielectric layer 14. In areas outside of the MIM capacitor region 23, a RIE process is used to subtractively etch the layers 30, 32 from exposed portions of the top surface 21 of the dielectric layer 14. The etch chemistry may be adjusted during the RIE process to selectively remove each of the layers 30, 32.

The block mask 36 preserves the integrity of the layers 30, 32 in the MIM capacitor region 23 during the RIE process and defines an outer perimeter 35 for the preserved portions of layers 30, 32. Although the process forming the MIM capacitor requires an additional block mask 36, the block mask 36 is not needed at a critical mask level where the feature sizes and spaces are designed to the minimum capability of the available lithographic resolution and overlay abilities (tools and processes). Instead, the block mask 36 is a non-critical mask where feature sizes and spaces are larger than the minimum lithographic capability. As a result, extensive measurement and control over the block mask 36 is not required because the processes involved in the subtractive removal of the layers 30, 32 outside of the masked MIM capacitor region 23 do not have to be controlled tightly.

Figure 4A:
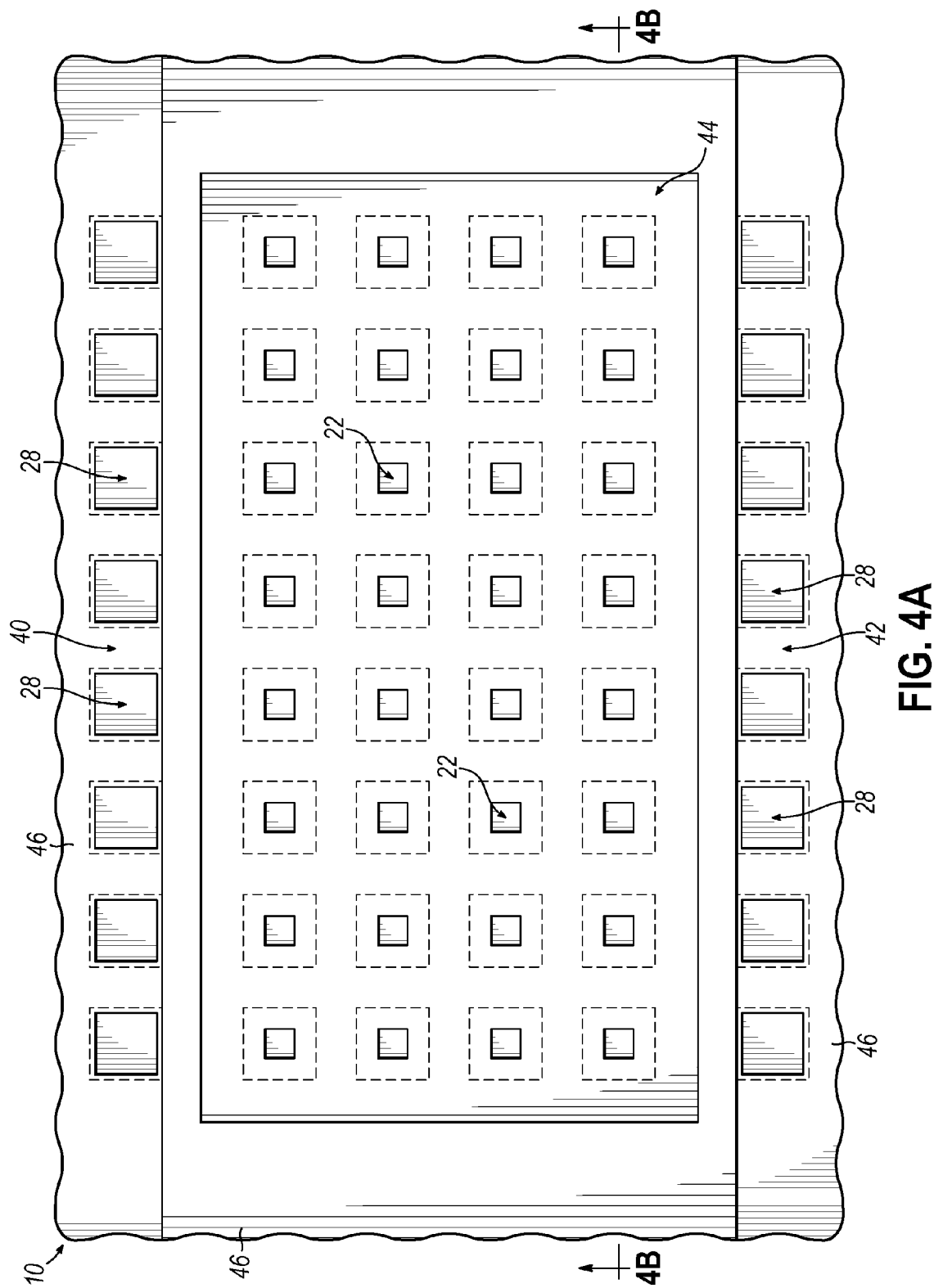
FIG. 4A is a top view of the substrate portion of FIG. 3A at a subsequent fabrication stage of the processing method.
Figure 4B:
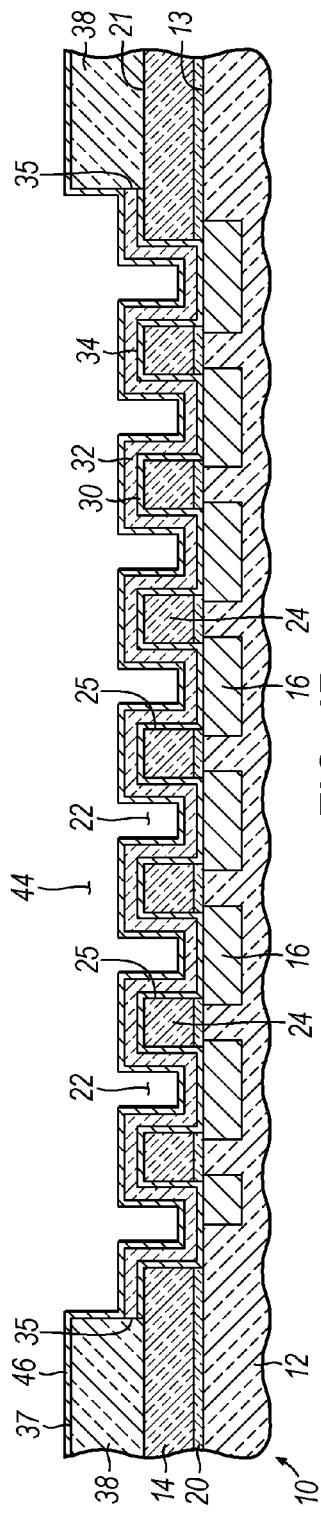
FIG. 4B is a cross-sectional view taken generally along line 4B-4B of FIG. 4A.

With reference to FIGS. 4A, 4B in which like reference numerals refer to like features in FIGS. 3A, 3B and at a subsequent fabrication stage, the block mask 36 (FIGS. 3A, 3B) is removed by, for example, chemical stripping or a plasma ashing process. A dielectric layer 38 is deposited on the top surface 13 of dielectric layer 14. The dielectric layer 38 may be formed of the same or different dielectric materials as dielectric layers 12, 14.

A conventional lithography and etch operation is used to form trenches 40, 42, 44 in the dielectric material of the dielectric layer 38. Trenches 40, 42 may be aligned with the vias 28. Trench 44 may be aligned with the MIM capacitor region 23 over which the apertures 22 and the residual lines 24, 26 of dielectric layer 14 are coated by layers 30, 32. In the lithography operation, a resist layer (not shown) is applied to cover a top surface 37 of the dielectric layer 38, exposed to impart a latent image pattern, and developed to transform the latent image pattern into a final image pattern having unmasked areas at the intended locations for the trenches 40, 42, 44. The dielectric layer 38 is etched with an etching process, such as RIE, using the patterned resist as an etch mask to localize the trenches 40, 42, 44. After the etching process concludes, residual resist is stripped by, for example, oxygen plasma ashing or chemical stripping.

A liner layer 46 is applied that conformally coats the apertures 22, vias 28, and trenches 40, 42, 44, as well as coats the top surface 37 of dielectric layer 38. The liner layer 46 may be comprised of any conductive material or multilayer combination of conductive materials recognized by a person having ordinary skill in the art. Liner layer 46 may comprise a conductive material such as titanium nitride (TiN), tantalum nitride (TaN), titanium (Ti), ruthenium (Ru), a tantalum-ruthenium alloy (TaRu), tungsten (W), tungsten nitride (WN), chromium (Cr), niobium (Nb), or another suitable conductive material or layered combination of conductive materials. The properties of the conductive material are suitable to operate as a diffusion barrier and an adhesion promoter for a subsequent metal plating operation used to fill the apertures 22, vias 28, and trenches 40, 42, 44. The liner layer 46 may be deposited, for example, by conventional deposition processes well known to those skilled in the art, including but not limited to physical vapor deposition (PVD), ionized-PVD (iPVD), ALD, plasma-assisted ALD, CVD, or PECVD.

Figure 5B:
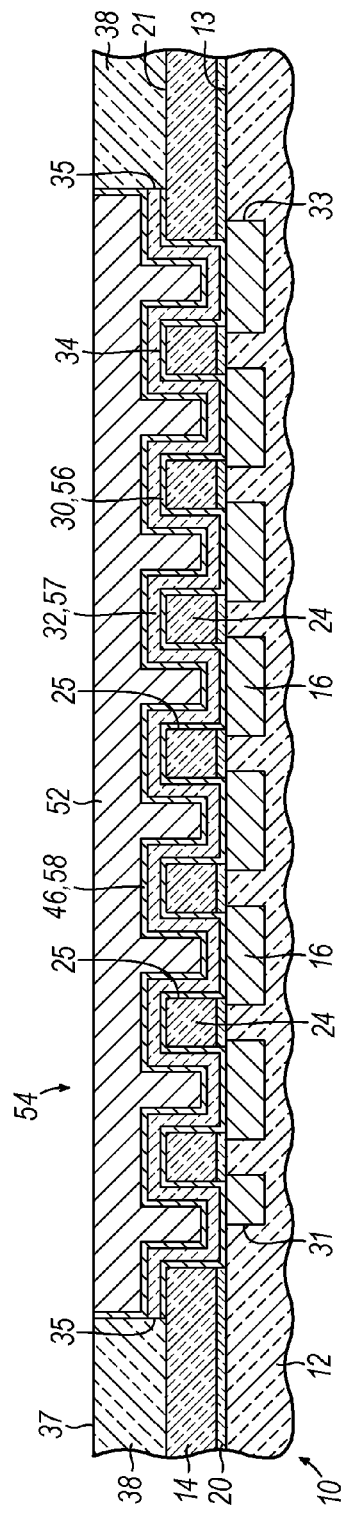
FIG. 5B is a cross-sectional view taken generally along line 5B-5B of FIG. 5A.
Figure 5A:
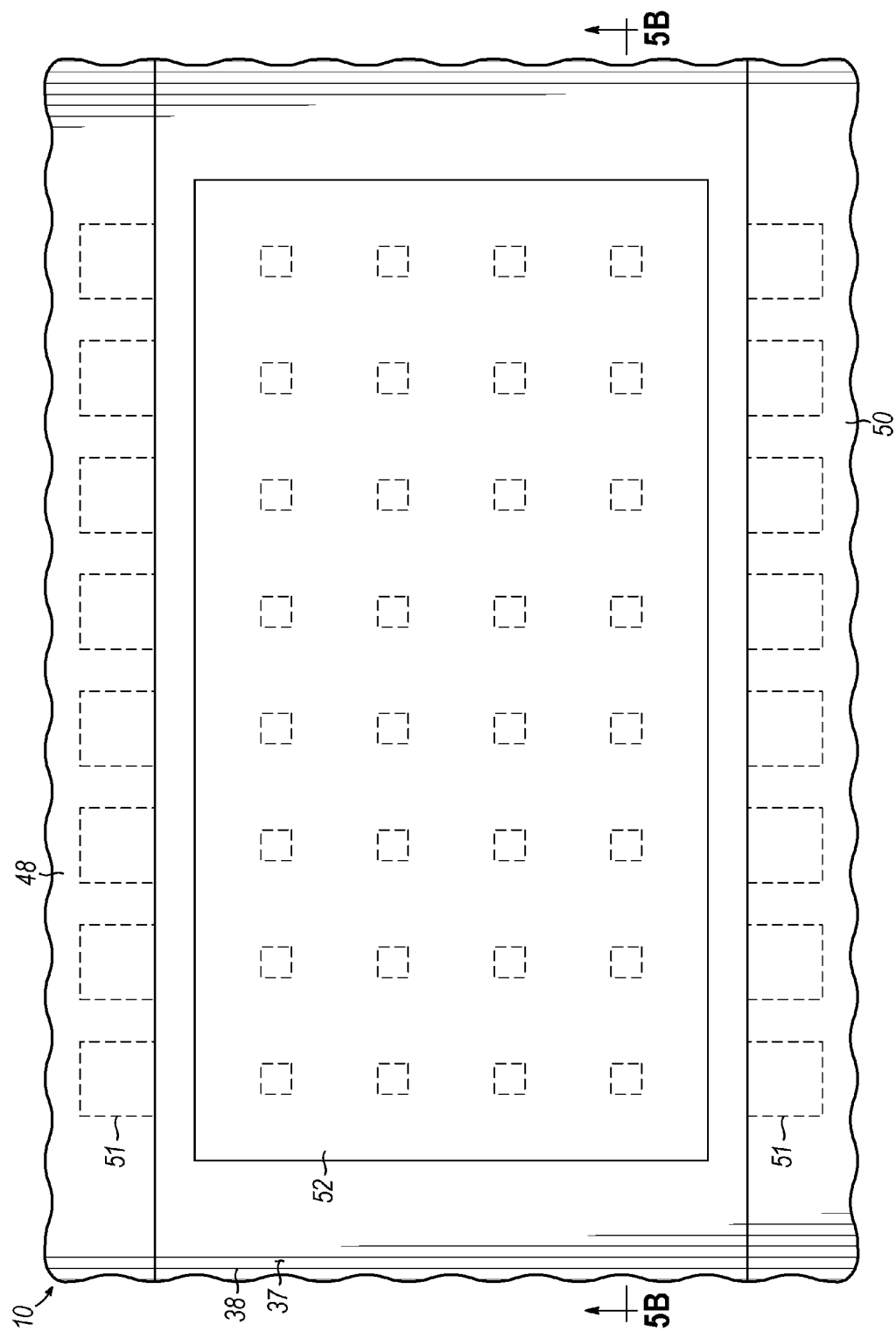
FIG. 5A is a top view of the substrate portion of FIG. 4A at a subsequent fabrication stage of the processing method.

With reference to FIGS. 5A, 5B in which like reference numerals refer to like features in FIGS. 4A, 4B and at a subsequent fabrication stage, conductive lines 48, 50, 52 are formed as wiring features in the open volumes inside the trenches 40, 42, 44, respectively, and conductive plugs 51 are formed in the open volumes inside the vias 28. Conductive lines 48, 50, 52 and conductive plugs 51 are comprised of a conductor such as copper (Cu), aluminum (Al), binary alloys such as AlCu, and other similar metals. The conductor may be deposited as a blanket layer by a conventional deposition process, such as an electrochemical process like electroplating or electroless plating. Before the performance of an electrochemical process, a thin seed layer (not shown) may be deposited on the trenches 40, 42, 44 and vias 28 by CVD or PVD to facilitate the electrochemical formation of the conductive lines 48, 50, 52.

A chemical-mechanical polishing (CMP) process is used to remove excess liner material and conductor from the top surface 37 of dielectric layer 38 and to planarized the conductive lines 48, 50, 52 flush with the top surface 37 of dielectric layer 38. Conductive lines 48, 50 are electrically and physically connected by the conductive plugs 51 with the conductive wiring features 18 in dielectric layer 12.

Additional metallization levels and via levels (not shown) may be stacked above the $M_{x+1}$ level and may be fabricated by deposition, lithography, and etching operations similar to those described above for forming the $M_{x+1}$ level.

Layer 30 in the MIM capacitor region 23 functionally defines a bottom plate or electrode 56 of a MIM capacitor 54. Liner layer 46 in the MIM capacitor region 23 functionally defines a top plate or electrode 58 of the MIM capacitor 54. The conductive line 52 is electrically and physically connected with the top electrode 58. The layer 32 of dielectric material interposed between liner layer 46 and layer 30 forms an insulative capacitor dielectric 57, which functions to electrically insulate the top electrode 58 from the bottom electrode 56. The MIM capacitor region 23 and the conductive wiring feature 16 may be positioned relative to each other such that one or more peripheral edges 31 of the conductive wiring feature 16 are disposed inside the lateral boundary of the bottom electrode 56 at the level of the top surface 13 of dielectric layer 12 and/or such that one or more peripheral edges 33 are disposed outside of the lateral boundary of the bottom electrode 56 at the level of the top surface 13 of dielectric layer 12.

The superjacent layers 30, 32, 46 provide a layer stack that coats the top surface 21 of the dielectric layer 14 in the MIM capacitor region 23, as well as the sidewalls 25 bounding the apertures 22 and the areas of the top surface 13 of dielectric layer 12 and conductive wiring feature 16 exposed at the base of each aperture 22. The bottom and top electrodes 56, 58 and the capacitor dielectric 57 have a three-dimensional, non-planar topology that increases the effective plate area of the MIM capacitor 54 and, therefore, increases the capacitance of the MIM capacitor 54 while presenting a compact footprint within the MIM capacitor region 23. The layers 30, 32, 46 conform to the topology of the underlying patterned dielectric layer 14.

The capacitance of the MIM capacitor 54 is proportional to the overlapping surface area of the bottom and top electrodes 56, 58. The topology provided by the apertures 22 in the MIM capacitor region 23 of the dielectric layer 14 increases the capacitance density in the MIM capacitor 54, which reduces the surface area required to achieve a needed capacitance value in comparison with conventional MIM capacitor structures. In one embodiment, the a real reduction for an equivalent capacitance value may be as large as 50%. The construction of the MIM capacitor 54 may overcome difficulties between electrode and plate integration, may reduce defect density by reducing difficulties experience with electrode and plate integration, may improve capacitor reliability, and may reduce cost by replacing one or more critical masks with a non-critical mask, namely block mask 36.

In use, either the top electrode 58 or the bottom electrode 56 may be electrically connected to power and the other of the top electrode 58 or the bottom electrode 56 may be electrically connected to ground. For example, the top electrode 58 may be electrically connected to $V_{DD}$ and the bottom electrode 56 may be electrically connected to $V_{SS}$.

Figure 6:
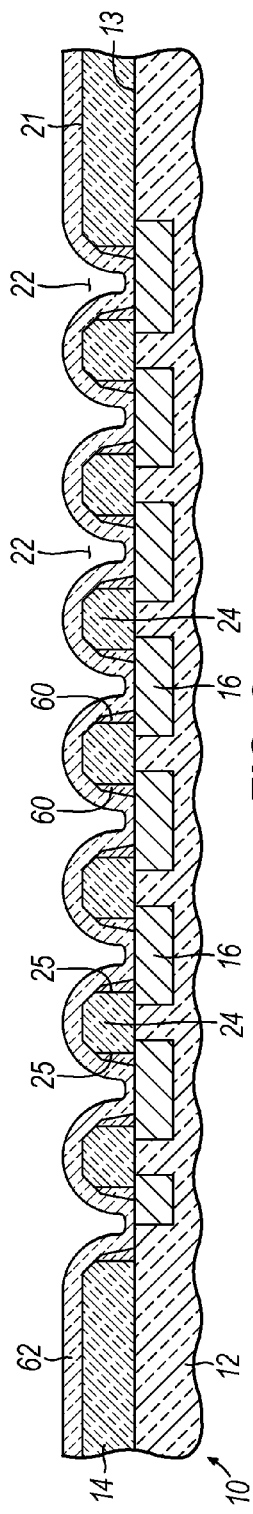
FIG. 6 is a cross-sectional view similar to FIG. 1B at an initial fabrication stage of a MIM capacitor constructed in accordance with an alternative embodiment of the invention.

With reference to FIG. 6 in which like reference numerals refer to like features in FIG. 1B and in accordance with an alternative embodiment, the shape of the residual lines 24, 26 in the MIM capacitor region 23 may be modified before the layers 30, 32 are deposited. The shape modification may operate to reduce any potential issues with the corners of the residual lines 24, 26.

In one embodiment, spacers 60 are formed on the residual lines 24, 26 of the dielectric layer 14 as a shaper modifier before the layers 30, 32 are deposited. The spacers 60 may be formed on the sidewalls 25 of residual lines 24, 26 by a conventional spacer formation process. For example, the spacers 60 may be formed by depositing a conformal layer of an electrically insulating material, such as a thickness of $Si_3N_4$ deposited by CVD, and anisotropic etching the conformal layer to preferentially remove the electrically insulating material from horizontal surfaces. In an alternative embodiment, the spacers 60 may be formed directly using a PECVD process. The spacers 60 round the corners of the sidewalls 25 associated with the residual lines 24, 26.

In one embodiment, a conformal insulating layer 62 comprised of a dielectric material may be deposited across the residual lines 24, 26. The conformal insulating layer 62 is added as a shaper modifier before the layers 30, 32 are deposited and, in the representative embodiment, after the spacers 60 are formed. The conformal insulating layer 62 may be comprised of $SiO_2$ deposited by CVD using tetraethylorthosilicate (TEOS)/ozone, $Al_2O_3$ deposited by ALD, $SiO_2$ or $Si_3N_4$ deposited with LPCVD, etc. The conformal insulating layer 62 further rounds the corners of sidewalls 25 associated with the residual lines 24, 26.

In an alternative embodiment, the spacers 60 may be omitted and only the conformal insulating layer 62 may be applied on the residual lines 24, 26 in the MIM capacitor region 23 as a shaper modifier. In another alternative embodiment, the conformal insulating layer 62 may be omitted and only the spacers 60 may be applied on the residual lines 24, 26 in the MIM capacitor region 23 as a shaper modifier.

With reference to FIG. 7 in which like reference numerals refer to like features in FIG. 5B and in accordance with an alternative embodiment, the top electrode of the MIM capacitor 54 may be formed by depositing a layer 66 on layer 32 before the block mask 36 is formed. Layer 66 may be comprised of the same conductive materials and formed by the same deposition techniques as layer 30. Processing continues by removing regions of layers 30, 32, 66 that are not protected by the block mask 36 (FIGS. 2A, 2B), and then with the process flow described above (FIGS. 3A, 3B-5A, 5B) resulting in the final structure shown in FIG. 5B.

With reference to FIG. 8 in which like reference numerals refer to like features in FIG. 5B and in accordance with an alternative embodiment, the bottom and top electrodes 56, 58 of the MIM capacitor 54 may be contacted from above with conductive features in metallization level ($M_{x+1}$). As a consequence, the conductive wiring feature 16 may be omitted from a location in dielectric layer 12 beneath the MIM capacitor region 23.

A peripheral strip 63 of layer 30 is exposed by trimming layer 32 and layer 66 is trimmed to provide a lateral spacing of layer 66 from the peripheral strip 63 of layer 30. The layer trimming requires two critical masks and conventional lithography and etching processes to produce the tiered side edges that promote the establishment of electrical contact with the peripheral strip 63 of layer 30. Specifically, an initial patterned resist layer (not shown) is formed on layer 66 and a RIE process is used to trim the edge of layer 66. After the initial resist layer is removed, another patterned resist layer (not shown) is formed on layers 32, 66 and a RIE process is used to trim the edge of layer 32 and expose the peripheral strip 63 of layer 30.

Processing continues by applying block mask 36 and removing regions of layers 30, 32, 66 that are not protected by the block mask 36 (FIGS. 3A, 3B), and continues with the process flow described above (FIGS. 4A, 4B-5A, 5B) to result in the final structure shown in FIG. 8. When the trench 44 is formed, another trench 70 is provided that is aligned with the peripheral strip of layer 30. The trench 70 is filled by a conductive wiring feature 72 that contacts the peripheral strip 63 of layer 30. In a representative embodiment, the perimeter 53 of the conductive line 52 may be recessed relative to the end of layer 66. Alternatively, the perimeter 53 of the conductive line 52 may be flush with the end of layer 66.

Figure 9A:
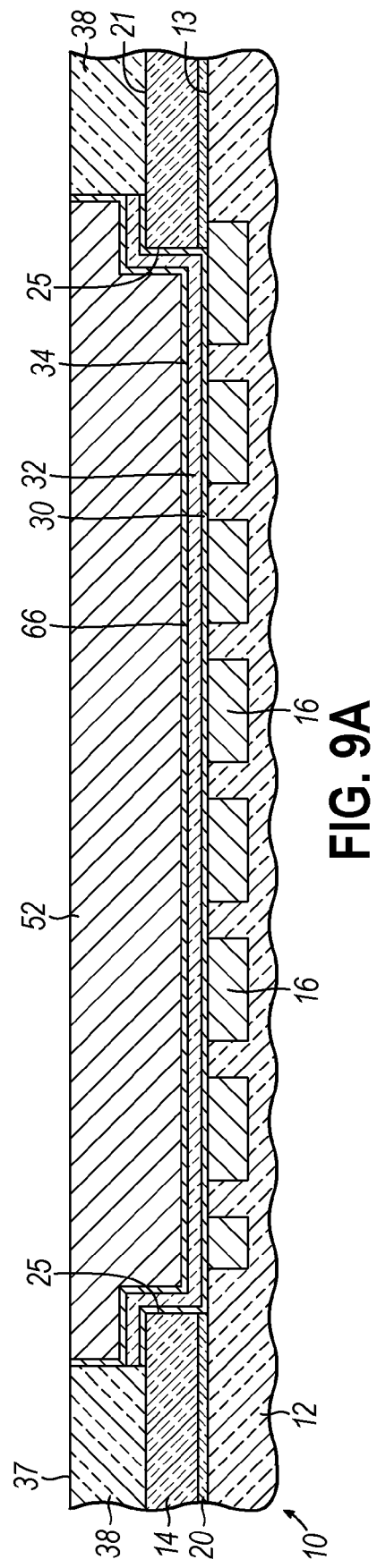
FIG. 9A is a cross-sectional view similar to FIG. 9 taken in a slotted opening between adjacent via bars.

With reference to FIGS. 9, 9A in which like reference numerals refer to like features in FIG. 5B and in accordance with an alternative embodiment, the apertures 22 may be elongated to define slotted openings that perforate the dielectric layer 14 and etch stop layer 20 in the MIM capacitor region 23. Residual parallel via bars 80 of the dielectric material from dielectric layer 14 are defined by the etching process as lines between adjacent pairs of the elongated apertures 22. Processing continues by depositing layers 30, 32 (FIGS. 2A, 2B), and following the process flow described above (FIGS. 1A, 1B-5A, 5B) resulting in the final structure shown in FIGS. 9, 9A. In the elongated slots between adjacent pairs of via bars 80, layer 30 directly contacts the conductive wiring feature 16 as apparent in FIG. 9A. This provides electrical contact from underneath the MIM capacitor 54 between the bottom electrode 56 and the conductive wiring feature 16.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A metal-insulator-metal (MIM) capacitor comprising:
a first interlayer dielectric (ILD) layer having a top surface, a plurality of apertures, a first surface area with a perimeter surrounding the apertures, and a second surface area surrounding the first surface area, each aperture including a plurality of sidewalls that extend from the top surface of the first ILD layer into the first ILD layer;
a conformal dielectric layer on the top surface of the first ILD layer and the sidewalls of the apertures; and
a layer stack on the conformal dielectric layer, the layer stack including a first electrode and a capacitor dielectric layer, and the first electrode separated from the first ILD layer by the conformal dielectric layer.

2. The MIM capacitor of claim 1 further comprising:
a second interlayer dielectric (ILD) layer having a top surface on which the first ILD layer is formed, each aperture extending through the first ILD layer from the top surface of the first ILD layer to the top surface of the second ILD layer so that a depth of the apertures is approximately equal to a layer thickness of the first ILD layer.

3. The MIM capacitor of claim 2 wherein the second ILD layer includes a wiring feature exposed along the top surface of the second ILD layer, at least one of the apertures lands on the wiring feature, and the first electrode contacts the wiring feature.

4. The MIM capacitor of claim 1 wherein the apertures have an elongated geometry that partitions the first ILD layer into a plurality of via bars.

5. The MIM capacitor of claim 1 wherein the first ILD layer comprises a dielectric material, and the apertures are square or rectangular such that the dielectric material is partitioned by the apertures into a grid of intersecting lines.

6. The MIM capacitor of claim 1 wherein the layer stack further includes a second electrode separated from the first electrode by the capacitor dielectric layer.

7. The MIM capacitor of claim 1 wherein the conformal dielectric layer comprises silicon dioxide ($SiO_2$), silicon nitride ($Si_3N_4$), or aluminum oxide ($Al_2O_3$).

\* \* \* \* \*